(12) United States Patent
Kunimoto et al.

(10) Patent No.: US 8,530,753 B2
(45) Date of Patent: Sep. 10, 2013

(54) FINE WIRING PACKAGE AND METHOD OF MANUFACTURING THE SAME

(75) Inventors: Yuji Kunimoto, Nagano (JP); Akihiko Tateiwa, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 317 days.

(21) Appl. No.: 12/643,193

(22) Filed: Dec. 21, 2009

(65) Prior Publication Data
US 2010/0155126 A1    Jun. 24, 2010

(30) Foreign Application Priority Data
Dec. 24, 2008  (JP) ................................. 2008-328488

(51) Int. Cl.
*H05K 1/16*    (2006.01)

(52) U.S. Cl.
USPC ............ 174/260; 174/261; 174/255; 174/259

(58) Field of Classification Search
None
See application file for complete search history.

(56) References Cited

U.S. PATENT DOCUMENTS

| | | | | |
|---|---|---|---|---|
| 5,422,513 A * | 6/1995 | Marcinkiewicz et al. | .... | 257/668 |
| 5,866,952 A * | 2/1999 | Wojnarowski et al. | ....... | 257/788 |
| 6,154,366 A | 11/2000 | Ma et al. | | |
| 6,195,260 B1 * | 2/2001 | Moriyama | ..................... | 361/749 |
| 6,528,889 B1 * | 3/2003 | Matsuhira et al. | ............ | 257/778 |
| 7,852,634 B2 | 12/2010 | Sakamoto et al. | | |
| 2003/0016511 A1 * | 1/2003 | Tomita et al. | .................. | 361/783 |
| 2005/0006744 A1 * | 1/2005 | Ooi et al. | ........................ | 257/686 |
| 2007/0044303 A1 * | 3/2007 | Yamano | ........................... | 29/830 |
| 2007/0052091 A1 | 3/2007 | Weekamp et al. | | |
| 2007/0086166 A1 * | 4/2007 | Kurita et al. | ................... | 361/704 |
| 2008/0032447 A1 | 2/2008 | Lee | | |
| 2008/0111230 A1 * | 5/2008 | Kim et al. | ..................... | 257/700 |

FOREIGN PATENT DOCUMENTS

| | | |
|---|---|---|
| JP | H7-007134 | 1/1995 |
| JP | H8-162604 | 6/1996 |
| JP | 9-321408 | 12/1997 |
| JP | H11-214849 | 8/1999 |
| JP | 2001-352021 | 12/2001 |
| JP | 2002-246757 | 8/2002 |
| JP | 2002-280744 | 9/2002 |
| JP | 2004-014629 | 1/2004 |
| JP | 2006-511085 | 3/2006 |

* cited by examiner

*Primary Examiner* — Tuan T Dinh
*Assistant Examiner* — Steven Sawyer
(74) *Attorney, Agent, or Firm* — Drinker Biddle & Reath LLP

(57) ABSTRACT

At least one electronic component having a plurality of terminals on one of surfaces is temporarily fixed to a surface of a first support with a first adhesive layer in such a manner that the terminal side of the electronic component faces the first support. A second support having a second adhesive layer is fixed to the electronic component in order to interpose the electronic component between the first support and the second support. The first support and the first adhesive layer are peeled. The electronic component on the second support is sealed with a sealing resin in such a manner that at least a part of the terminals of the electronic component is exposed. An insulating resin layer and a wiring layer to be electrically connected to the terminal of the electronic component are stacked on the electronic component and the sealing resin.

4 Claims, 7 Drawing Sheets

FINE WIRING PACKAGE AND METHOD OF MANUFACTURING THE SAME

This application claims priority to Japanese Patent Application No. 2008-328488, filed Dec. 24, 2008, in the Japanese Patent Office. The Japanese Patent Application No. 2008-328488 is incorporated by reference in its entirety.

TECHNICAL FIELD

The present disclosure relates to a semiconductor package and more particularly to a fine wiring package which can be used as a general package of a semiconductor integrated circuit and a method of manufacturing the fine wiring package.

RELATED ART

Usually, at least one active element or passive element is fixed onto a fine wiring package through a sealing resin. A wiring layer and an insulating resin layer are stacked on the individual active element or passive element.

In a method of manufacturing the fine wiring package which includes at least one active element or passive element, a support is used and each element is provided on the support through an adhesive layer and is sealed with a resin, a wiring layer and an insulating resin layer are then stacked, and the support is thereafter removed to complete the fine wiring package.

In the method of manufacturing the fine wiring package using the support as described above, in some cases in which the active elements or passive elements are provided on the support, it is necessary to seal each of the elements with a terminal surface thereof aligned over the same plane. For these cases, description will be given to a general method of manufacturing a fine wiring package.

FIGS. 1A to 1F show the related art of the case in which an electronic component such as a plurality of active elements or passive elements is provided on a support, is sealed with a resin and is incorporated into a package, and each of the active elements or passive elements is aligned on the same plane based on a terminal side of each of the elements.

First of all, in FIG. 1A, a passive element 12 and active elements 14 and 16 are provided on a support 10 through an adhesive 20. Terminals 12a, 14a and 16a of the passive element 12 and the active elements 14 and 16 are aligned over an upper surface of the support 10.

In FIG. 1B, next, the components such as the passive element 12 and the active elements 14 and 16 which are provided on the support 10 are sealed with a resin 22. There is a possibility that positions of the components might be shifted by a pressure in an injection of the resin 22 or the resin 22 might be mixed to contaminate the terminals 12a, 14a and 16a.

In FIG. 1C, subsequently, the support 10 is peeled after the resin 22 is cured and shrunk. There is a possibility that concavo-convex portions might be generated on a surface of the resin 22 due to the curing and shrinkage of the sealing resin or a warpage might occur on the surface of the resin 22 due to the peeling of the support 10.

In FIG. 1D, then, reversely in a vertical direction to FIGS. 1A to 1C, the terminal 12a, 14a and 16a side of the passive element 12 and the active elements 14 and 16 is set to be an upper side. A resin layer 24 is formed on a surface of a package, a via 26 to be connected to each of the terminals is formed, and a wiring pattern (a wiring layer) 28 to be connected to the via 26 is formed on the resin layer 24. As shown in FIG. 1E, thereafter, the resin layer 24 and the wiring layer 28 are alternately stacked so that the package is formed in a multilayer.

In FIG. 1E, the resin layer 24 and the wiring layer 28 are stacked alternately, and the connecting via 26 between the respective layers is formed to constitute a multilayer. Subsequently, a solder resist layer 30 is formed on an uppermost surface of the package and an external terminal 32 for an external connection which is to be connected to the uppermost wiring layer 28 is formed so that the package is completed.

FIG. 1F shows the fine wiring package thus completed. Surfaces of the terminals 12a, 14a and 16a of the passive element 12 and the active elements 14 and 16 are matched with a predetermined surface A defined by the surface of the support 10. In the case in which the passive element 12 and the active elements 14 and 16 include a radiating component, the sealing resin 22 on a back face of an electronic component (element) having a radiating property is peeled to expose the back face of the electronic component (not shown). A heat sink (not shown) is connected to the back face of the electronic component from which the sealing resin 22 is peeled if necessary to obtain an excellent radiating property.

In general, the related-art method of manufacturing the fine wiring package has the following drawback. In some cases in which a temporary bond of the support and the element is previously carried out weakly in consideration of a necessity for the support to be peeled from the package including the element at a subsequent step, the resin is mixed into a portion between the terminal and the support to contaminate the terminal or a position of the element is shifted from a predetermined position with respect to the support by a pressure in the injection of the resin when the element is temporarily bonded to the support and the resin sealing is then carried out.

To the contrary, when the support and the element are temporarily bonded strongly, an adhesive itself sticks to the terminal. Concavo-convex portions are generated on the terminal surface due to the curing and shrinkage of the sealing resin so that the terminal surface is not flattened. Since the support is peeled from the package, a warpage occurs over the package so that the terminal surface is not flattened. In the case in which a radiating component is additionally provided on the back face of the element, it is necessary to remove the sealing resin on the back face by polishing, thereby exposing the back face of the element again.

FIGS. 2A to 2E show another related art of the case in which a plurality of active elements or passive elements is provided on a support, is sealed with a resin and is incorporated into a package, and each of the elements is aligned on the same plane based on a back face side of each of the elements.

First of all, in FIG. 2A, a passive element 12 and active elements 14 and 16 are provided on a support 10 through an adhesive 20. A back side of the passive element 12 and the active elements 14 and 16 is aligned over an upper surface of the support 10.

In FIG. 2B, next, the electronic components such as the passive element 12 and the active elements 14 and 16 which are provided on the support 10 are sealed with a resin 22. There is a possibility that positions of the components might be shifted by a pressure in an injection of the resin 22 or the resin 22 might be mixed to contaminate terminals 12a, 14a and 16a.

In FIG. 2C, subsequently, a via 26 is formed on the sealed resin layer 22 and a wiring layer 28 is formed on the resin layer 22. The components such as the active element 12 and the passive elements 14 and 16 which are provided on the support 10 have back sides aligned over the upper surface of the support 10. In the formation of the via 26 to be connected to the terminal of each of the elements, therefore, a depth of a conducting hole is varied in each of the elements. Consequently, it is hard to form the conducting hole.

In FIG. 2D, the wiring pattern (the wiring layer) 28 to be connected to the via 26 is formed on the resin layer 22. Then, a resin layer 24 and the wiring layer 28 are alternately stacked and the via 26 for connecting the respective layers is formed to constitute a multilayer. A solder resist layer 30 is foliated on an upper most surface of the package and an external terminal 32 for an external connection which is to be connected to the uppermost wiring layer 28 is formed so that the package is completed. On the other hand, the support 10 is peeled from the package after the package is completed.

In FIG. 2E, there is completed the fine wiring package in which the back faces of the passive element 12 and the active elements 14 and 16 are exposed from the sealing resin 22. The back face of each of the components is exposed from the sealing resin 22, which is convenient in the case in which a heat sink (not shown) is connected to the back face of the component if necessary. On the other hand, heights of surfaces of the electrode terminals 12a, 14a and 16a of the passive element 12 and the active elements 14 and 16 are not uniform due to a difference in a height of each of the electronic components as is indicated by B1, B2 and B3. Consequently, a height of the via 26 for connecting the electrode terminals 12a, 14a and 16a of the electronic components such as the passive element 12 and the active elements 14 and 16 to the wiring layer 28 is not uniform for each of the electronic components.

The related art related to the invention has been described in U.S. Pat. No. 6,154,366 Specification. According to the related art, in a method of manufacturing a fine electronic component package, a fine electronic component element including an active surface having at least a terminal, a back face and a side surface is prepared, a first surface of an insulating layer is bonded to the active surface of the element, a wiring layer is formed on a second surface of the insulating layer, a part of the wiring layer is connected to the terminal of the element with a penetration through the insulating layer, the element side is sealed with a resin so that a first surface of the sealing resin is constituted to be adjacent to a bottom face of the insulating layer, and a barrier layer for preventing a moisture is formed on the insulating layer and the wiring layer. By the structure, it is possible to prevent a metal of the wiring layer from being corroded and to inhibit the insulating layer from being deteriorated.

[Patent Document 1] U.S. Pat. No. 6,154,366 Specification

As described above, according to the related-art method of manufacturing the fine wiring package, it is necessary to set the temporary bond of the support and the element slightly weakly in consideration of the fact that the support is to be peeled at the subsequent step. In some cases in which the extent of the temporary bond is reduced, however, the resin is mixed into the portion between the terminal and the support to contaminate the terminal or the position of the element is shifted by a pressure in the injection of the resin when the resin sealing is carried out. To the contrary, if the temporary bond of the support and the element is set slightly strongly, there is a problem in that the adhesive itself sticks to the terminal, concavo-convex portions are generated on the sealing resin surface due to the curing and shrinkage of the sealing resin and the terminal surface is not flattened, and a warpage occurs and the terminal surface is not flattened because the support is peeled. When the insulating layer is to be formed on the sealing resin, moreover, there is a problem in that concavo-convex portions are generated on the insulating resin corresponding to a height of the terminal of the electronic component exposed from the sealing resin, a defect is caused in a subsequent formation of a wiring and a wiring having a high reliability cannot be formed.

SUMMARY

Exemplary embodiments of the present invention provide a manufacturing method capable of obtaining a suitable package for a fine wiring in which a terminal surface of an electronic component constituting the package is set to have a uniform height to easily carry out an electrical connection of a terminal and a wiring through a conducting hole connected to each terminal, and the package is formed in a supporting state on a support to prevent a position of each portion from being shifted till a final stage of a package manufacturing process, and a fine wiring package thus manufactured.

A method of manufacturing a fine wiring package according to the exemplary embodiment of the invention comprises steps of:

temporarily fixing at least one electronic component having a plurality of terminals on one of surfaces to a surface of a first support with a first adhesive layer in such a manner that the terminal side of the electronic component faces the first support;

fixing a second support having a second adhesive layer to the electronic component in order to interpose the electronic component between the first support and the second support in such a manner that the second adhesive layer faces a back face side of the electronic component, the back face side being an opposite side to the terminal side;

peeling the first support and the first adhesive layer after fixing the second support;

sealing the electronic component on the second support with a sealing resin in such a manner that at least a part of the terminals of the electronic component is exposed after peeling the first support and the first adhesive layer; and stacking, on the electronic component and the sealing resin, an insulating resin layer and a wiring layer to be electrically connected to the terminal of the electronic component.

The method may further comprise a step of:

forming a reinforcing plate on a surface of the sealing resin in a position placed on almost the level with the terminal of the electronic component after sealing the electronic component with the sealing resin The method may further comprise a step of:

peeling the second support and the second adhesive layer after stacking the insulating resin layer and the wiring layer.

In the method, a bonding force of the first adhesive may be smaller than that of the second adhesive.

A fine wiring package according to the exemplary embodiment of the invention comprises:

at least one electronic component having a plurality of terminals on one of surfaces;

a sealing resin which seals the electronic component to expose surfaces of the terminals of the electronic component in such a manner that the surfaces of the terminals of the electronic component are aligned over a predetermined plane;

a stacked structure which is formed on the electronic component and the sealing resin and includes an insulating resin layer and a wiring layer to be electrically connected to the terminals of the electronic component; and a reinforcing plate formed between the sealing resin and the insulating resin layer.

In the fine wiring package, the reinforcing plate may include a conductor layer. Alternatively, the reinforcing plate may include a conductive resin layer. One of surfaces of the reinforcing plate may be on almost the level with the surfaces of the terminals of the electronic component.

In the fine wiring package, the electronic component may be covered with the sealing resin except for at least a surface on an opposite side to a terminal forming surface of the electronic component on which the terminals are formed.

In the invention, the terminal side of at least one electronic component is temporarily fixed to the surface of the first support through the first adhesive layer and the back face side of the electronic component is fixed with the second support having the second adhesive layer. Even if heights of the respective electronic components are not uniform, therefore, the terminals of the electronic components are matched over the same plane. Accordingly, a distance (a depth) between the terminal and the wiring layer is uniform so that an electrical connection of the terminal and the wiring through a conducting hole can be carried out comparatively easily. Moreover, the package is held by the second support until the wiring layer is completely formed. Therefore, it is possible to considerably reduce a warpage of the package in a manufacture.

In the invention, furthermore, the resin sealing structure is employed. Therefore, a strength can be enhanced. It is possible to form a wiring layer by using the resin sealing structure as a core. Furthermore, the terminal surface of the electronic component can be obtained as the same plane which is flattened. Therefore, it is possible to form a fine wiring.

In the case in which the electronic component is subjected to the resin sealing and the reinforcing plate is then formed on the surface of the sealing resin on almost the level with the terminal of the electronic component, concavo-convex portions of the sealing resin are absorbed to contribute to flatten the terminal surface by the reinforcing plate. Moreover, the reinforcing plate can be utilized as a power layer or a ground layer. Thus, it is possible to enhance an electrical characteristic of the package. By utilizing the reinforcing plate as a radiating layer, furthermore, it is also possible to cause the package to have a radiating effect.

Other features and advantages may be apparent from the following detailed description, the accompanying drawings and the claims.

DETAILED DESCRIPTION

Exemplary embodiments according to the invention will be described below in detail with reference to the accompanying drawings.

FIGS. 3A to 3D, FIGS. 4A to 4E and FIGS. 5A and 5B show an embodiment of a method of manufacturing a fine wiring package according to the invention.

Each of electronic components such as a passive element 12 and active elements 14 and 16 has one surface which is flat (a first surface), and the other surface (a second surface) to be a back face which is also formed as a flat surface which is parallel with the first surface. The electronic components have a plurality of electrode terminals 12a, 14a and 16a on the first surfaces respectively. Surfaces of the electrode terminals 12a, 14a and 16a of the respective electronic components are also formed to be positioned on a constant plane for each component.

Figure 1A:
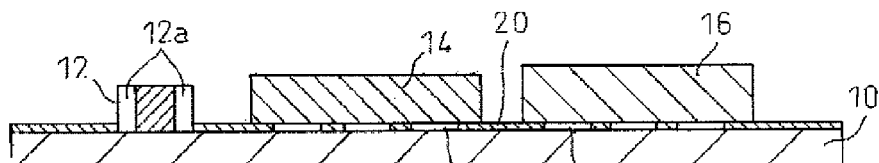
FIGS. 1A to 1F are process views showing an example of a method of manufacturing a fine wiring package in the related art.
Figure 1B:
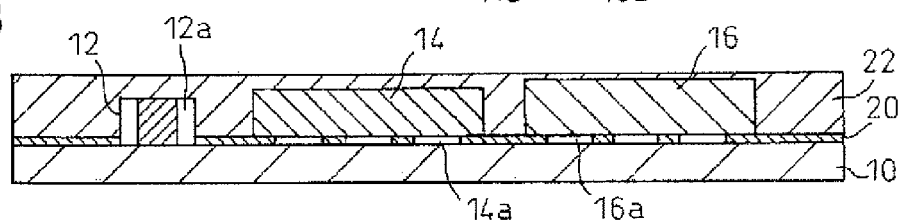
Figure 1C:
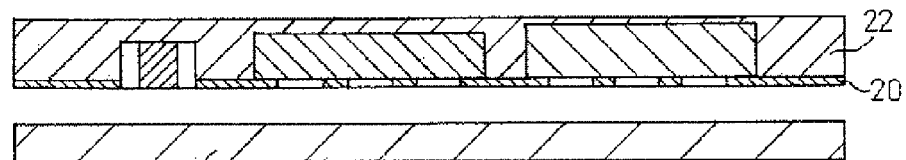
Figure 1D:
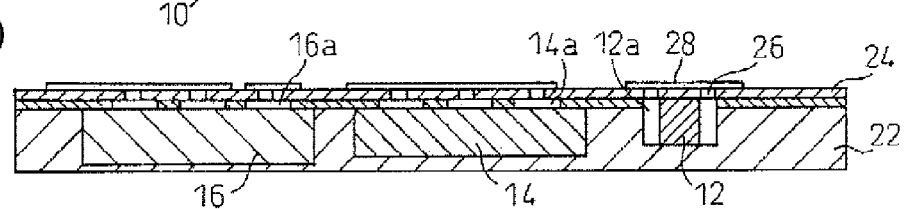
Figure 1E:
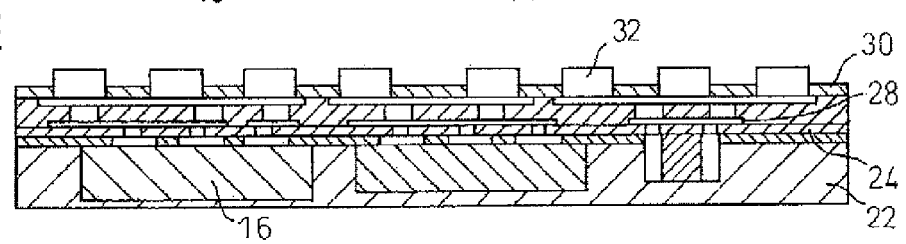
Figure 1F:
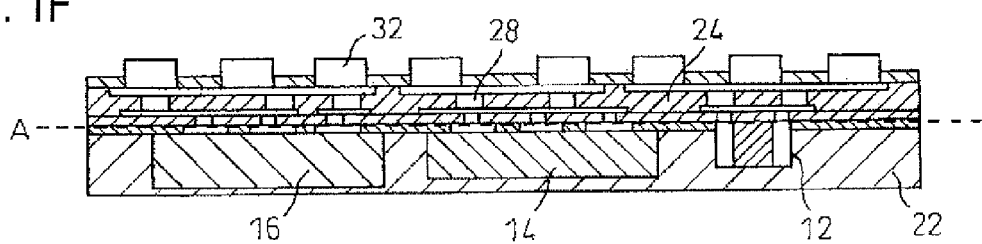
Figure 2A:
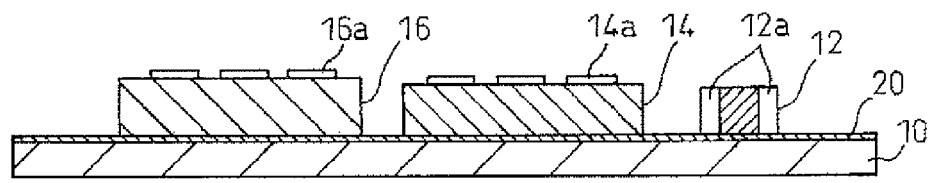
FIGS. 2A to 2E are process views showing another example of a method of manufacturing a fine wiring package in the related art.
Figure 2B:
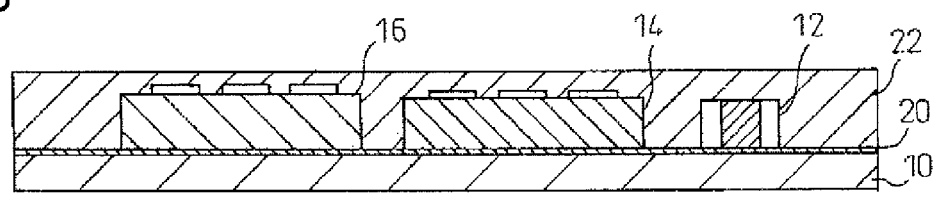
Figure 2C:
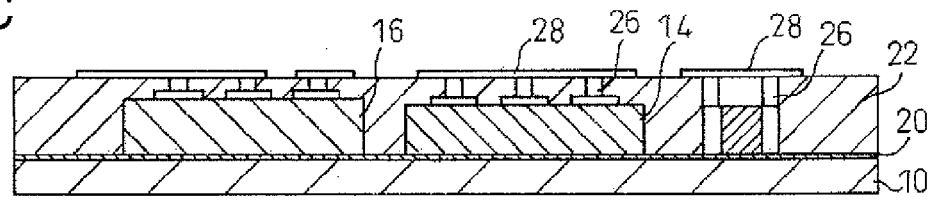
Figure 2D:
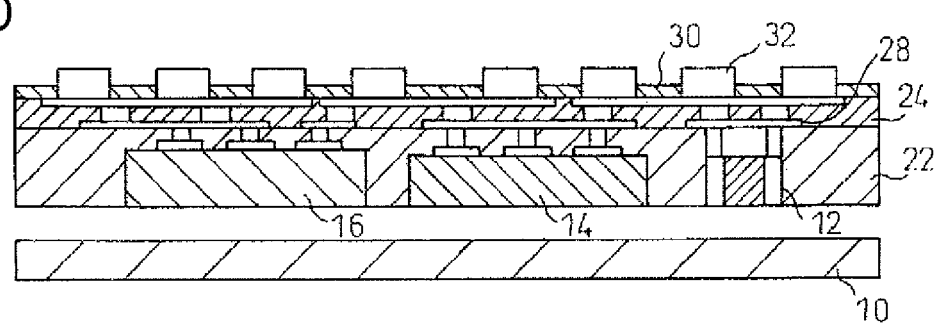
Figure 2E:
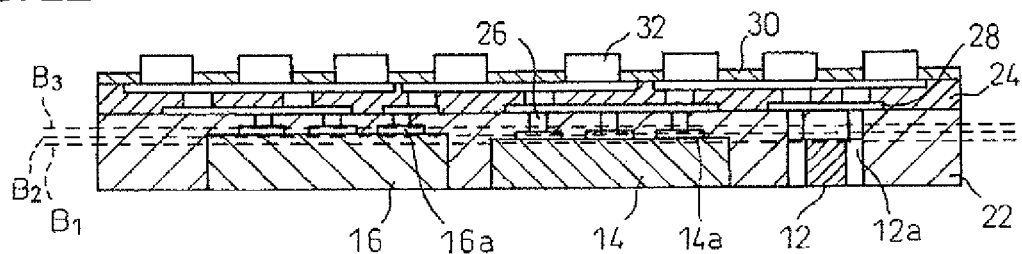
Figure 3A:
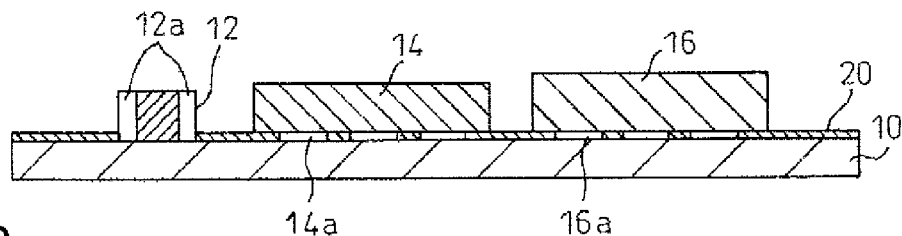
FIGS. 3A to 3D are process views showing a first embodiment of a method of manufacturing a fine wiring package according to the invention.

In FIG. 3A, the passive element 12 and the active elements 14 and 16 are provided on a first support 10 through an adhesive layer 20. The electrode terminals 12a, 14a and 16a of the passive element 12 and the active elements 14 and 16 are aligned over an upper surface of the support 10. It is suitable that the adhesive layer 20 should be as thin as possible (for example, approximately several μm to several tens μm) and should be hard in order to align positions of surfaces of the electrode terminals 12a, 14a and 16a in the respective electronic components. For a bonding strength of the adhesive layer 20, moreover, it is preferable to use a material which has slightly weak bonding strength and does not contaminate the surfaces of the electrode terminals 12a, 14a and 16a. As the adhesive layer 20, for example, it is possible to use a TRM tape manufactured by NITTO DENKO CORPORATION or REVALPHA (registered trademark) manufactured by the NITTO DENKO CORPORATION.

Figure 3B:
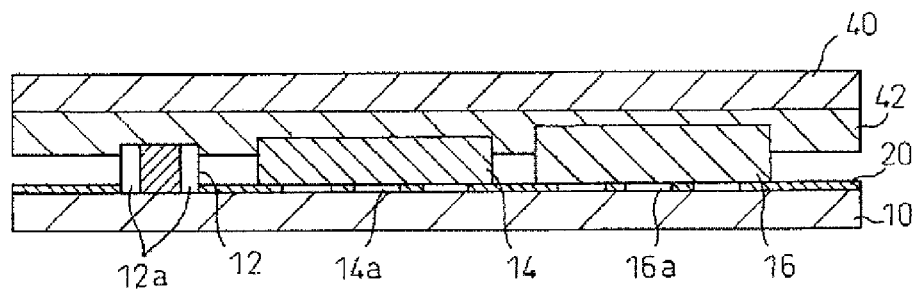

In FIG. 3B, next, a second support 40 having an adhesive layer 42 on one of surfaces is disposed in such a manner that the adhesive layer 42 is pressed and bonded to the back faces of the electronic components at an opposite side to the electrode terminals 12a, 14a and 16a of the electronic components provided on the first support 10. It is preferable that the adhesive layer 42 should be slightly thick (for example, a thickness of approximately several tens μm to several hundreds μm) in order to absorb a difference between thicknesses of the electronic components such as the passive element 12 and the active elements 14 and 16, that is, heights of the back faces of the electronic components. Moreover, it is preferable that the adhesive layer 42 should be semiliquefied (an ordinary temperature or heated) and should have a slightly great bonding force at time of press-bonding to the component. Furthermore, it is preferable that the adhesive layer 42 should be enabled to be peeled by an application of ultraviolet rays (UV) or heating.

Figure 3C:
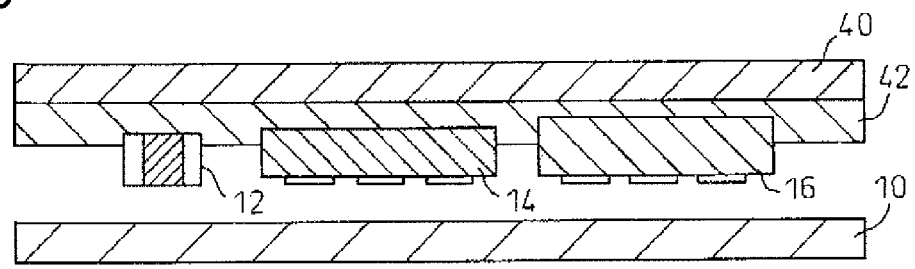
Figure 3D:
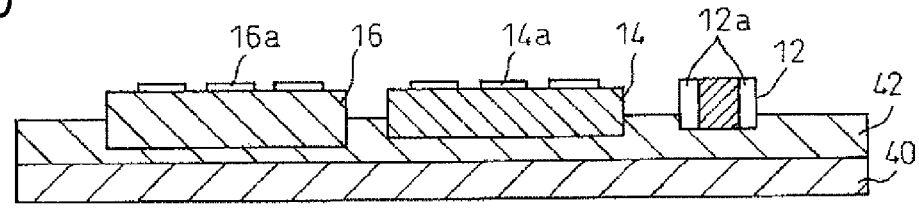

In FIG. 3C, subsequently, the first support 10 is peeled from the electrode terminals 12a, 14a and 16a of the passive element 12 and the active elements 14 and 16 which constitute a package. In this case, the adhesive layer 20 is weak and thin. Therefore, the adhesive layer 20 can easily be peeled by a UV irradiation or heating. FIG. 3D shows the package from which the first support 10 is thus peeled. In FIG. 3D, the package is inverted in such a manner that the electrode terminals 12a, 14a and 16a of the passive element 12 and the active elements 14 and 16 are set onto an upper side of the package, and subsequent steps are thus carried out.

Figure 4A:
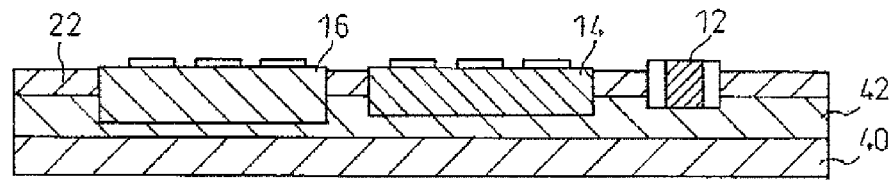
FIGS. 4A to 4E are process views showing process following the process of FIG. 3D in the first embodiment of the method of manufacturing a fine wiring package according to the invention.

In FIG. 4A, then, the components such as the passive element 12 and the active elements 14 and 16 provided on the second support 40 are sealed with a resin 22. In this case, a height of the sealing resin 22 is set to be equal to upper surfaces of the electronic components or is slightly lower than them. A specification of the resin 22 to be used for the sealing includes a liquid resin having an excellent filling property, and a mold material, an underfill material or a liquid resist material is used. Moreover, it is preferable to use a material which has a small curing and shrinking property and small thermal expanding property and has a strong sealing force. Moreover, there is used a suitable material for forming a wiring layer after the curing and shrinkage.

Figure 4B:
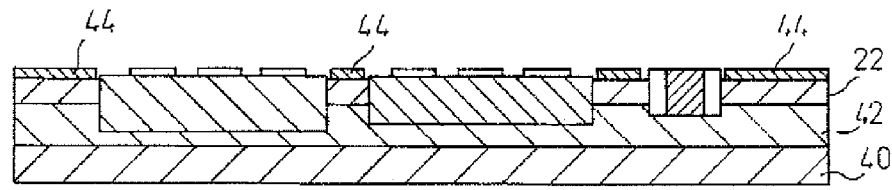

In FIG. 4B, thereafter, a conductor layer 44 is formed on a surface of the sealing resin 22. Consequently, the surface of the sealing resin 22 is stabilized so that positions of the terminals 12a, 14a and 16a of the electronic components 12, 14 and 16 are stabilized and they are flattened.

Figure 4C:
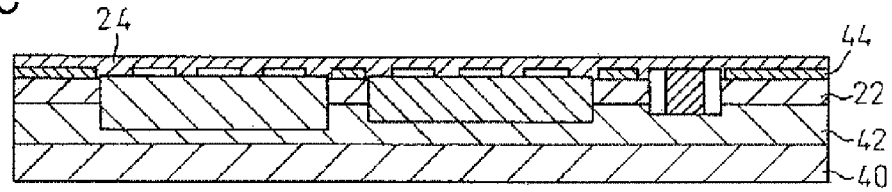

In FIG. 4C, subsequently, an insulating resin layer 24 is formed to cover the terminals 12a, 14a and 16a of the passive element 12 and the active elements 14 and 16 and the conductor layer 44 formed on the sealing resin 22.

Figure 4D:
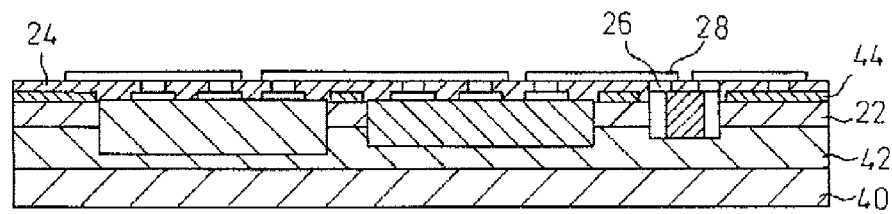
Figure 4E:
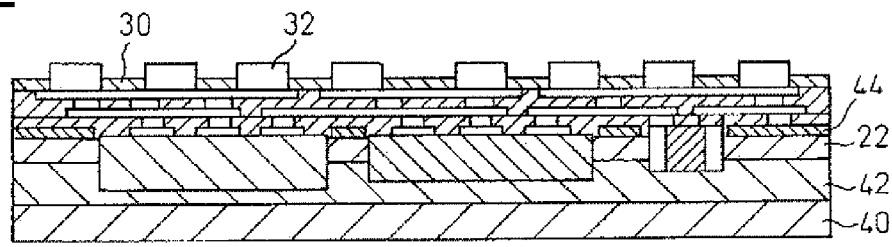

In FIG. 4D, a via 26 to be connected to each terminal is formed on the insulating resin layer 24 to penetrate therethrough, and a wiring pattern (a wiring layer) 28 to be connected to the via 26 is formed on the resin layer 24. As shown in FIG. 4E, then, the resin layer 24 and the wiring layer 28 are alternately stacked to form a package in a multilayer. A part of the wiring layer 28 is also connected to the conductor layer 44 through the via 26.

In FIG. 4E, the resin layer 24 and the wiring layer 28 are alternately stacked and the via 26 for connecting the respective layers is formed to constitute the multilayer. Then, a solder resist layer 30 is formed on an uppermost surface of the package and an external terminal 32 for an external connection which is to be connected to the uppermost wiring layer 28 is thereafter formed so that the package is completed on the second support 40.

Figure 5A:
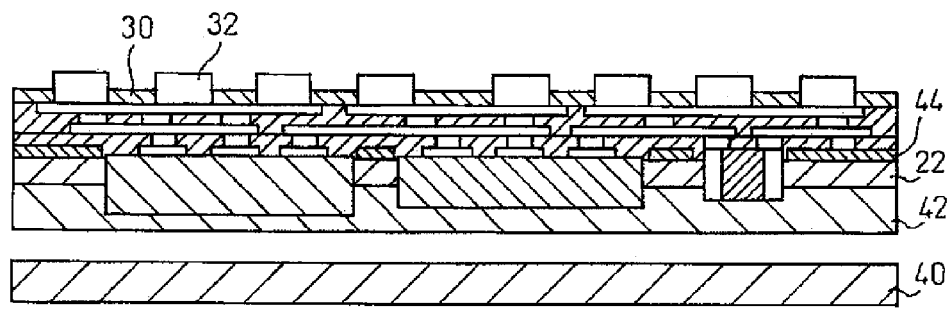
FIGS. 5A and 5B are process views showing process following the process of FIG. 4E in the first embodiment of the method of manufacturing a fine wiring package according to the invention.

In FIG. 5A, the second support 40 is peeled from the adhesive layer 42 of the package. Consequently, there is completed a fine wiring package according to the invention shown in FIG. 5B. In the case in which the second support 40 is peeled, the adhesive layer 42 may also be peeled together in such a manner that the back faces of the electronic components 12, 14 and 16 are formed to be exposed from the sealing resin 22.

Figure 5B:
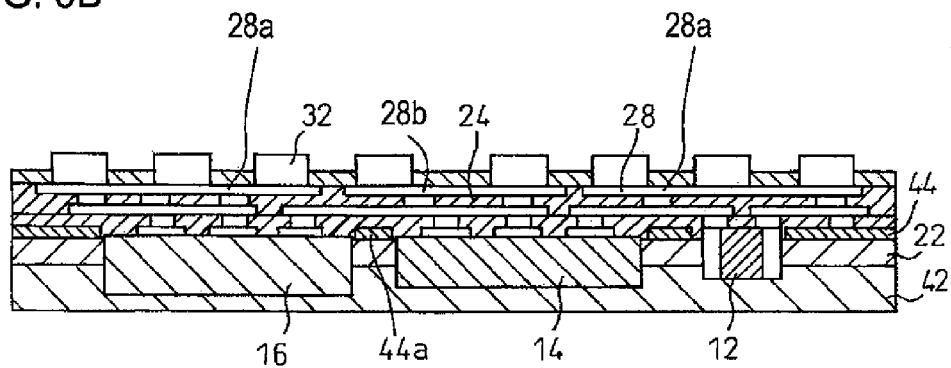
Figure 6:
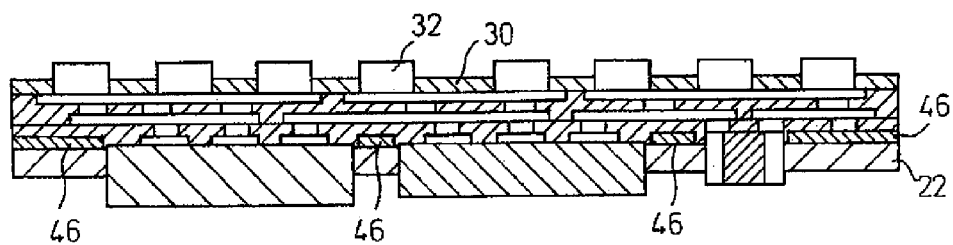
FIG. 6 is a sectional view showing a fine wiring package according to a second embodiment of the invention.

In FIG. 5B showing the fine wiring package which is completed, it is possible to enhance an electrical characteristic in the package by adding the conductor layer 44 as described above. For example, it is possible to obtain a so-called stripline (SL) structure in which a part 44a of the conductor layer 44 and a part 28b of the wiring layer 28 are grounded (connected to a GND) and a part of the wiring layer 28 is used as a signal layer (Signal) 28a so that the signal layer 28a is disposed in a sandwich shape through the insulating resin layer 24 by GND—GND layers. By the SL structure, it is possible to expect an electrical characteristic of the signal layer 28a, particularly, an effect for reducing a cross-talk noise.

FIGS. 6 to 9 show a variant of the fine wiring package according to the invention and are sectional views illustrating fine wiring packages according to second to fifth embodiments. In the second embodiment shown in FIG. 6, a metal reinforcing plate 46 is formed on a surface of a sealing resin 22 in place of the conductor layer 44 according to the first embodiment. Consequently, the surface of the sealing resin 22 is stabilized so that positions of terminals 12a, 14a and 16a of electronic components 12, 14 and 16 are stabilized and they are flattened.

Referring to the metal reinforcing plate 46, a part of a wiring layer 28 is also connected to the metal reinforcing plate 46 through a via 26 in the same manner as the conductor layer 44 according to the first embodiment. The other steps of manufacturing the fine wiring package according to the second embodiment are the same as those in the first embodiment. In the second embodiment, moreover, an adhesive layer 42 is also peeled together when a second support 40 is peeled, and back faces of the electronic components 12, 14 and 16 are formed to be exposed from the sealing resin 22. In the same manner as in the first embodiment, however, it is also possible to employ a structure in which the second support 40 is peeled from the adhesive layer 42 and the back faces of the electronic components 12, 14 and 16 are covered with the adhesive layer 42.

Figure 7:
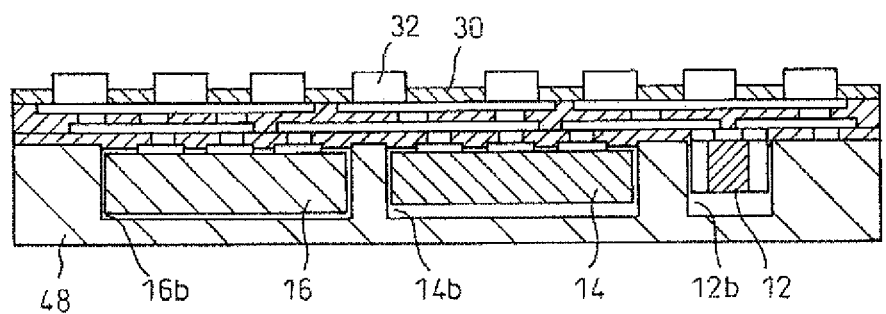
FIG. 7 is a sectional view showing a fine wiring package according to a third embodiment of the invention.

In the third embodiment shown in FIG. 7, a metal reinforcing plate 48 having a cavity structure is used in place of the conductor layer 44 according to the first embodiment. The metal reinforcing plate 48 has cavities 12b, 14b and 16b capable of accommodating electronic components such as a passive element 12 and active elements 14 and 16 which are to be incorporated into a package. At a corresponding step to FIG. 3B according to the first embodiment, the metal reinforcing plate 48 having the cavities 12b, 14b and 16b is temporarily fixed to a first support 10 through an adhesive 20 in place of an application of a second support 40 and an adhesive layer 42. In this case, the cavities 12b, 14b and 16b of the metal reinforcing plate 48 are disposed to cover a back face side of the respective electronic components 12, 14 and 16 respectively, and the electronic components 12, 14 and 16 are fixed to the metal reinforcing plate 48 with an adhesive.

At a corresponding step to FIG. 3C, then, the first support 10 is peeled, an insulating layer 24, a via 26 and a wiring layer 28 are formed in a multilayer with the electronic components 12, 14 and 16 held on the metal reinforcing plate 48, and a solder resist layer 30 and an external connecting terminal 32 are formed on an uppermost layer so that a package is completed. Also in the third embodiment, a part of the wiring layer 28 is also connected to the metal reinforcing plate 48 having the cavities through the via 26.

Figure 8:
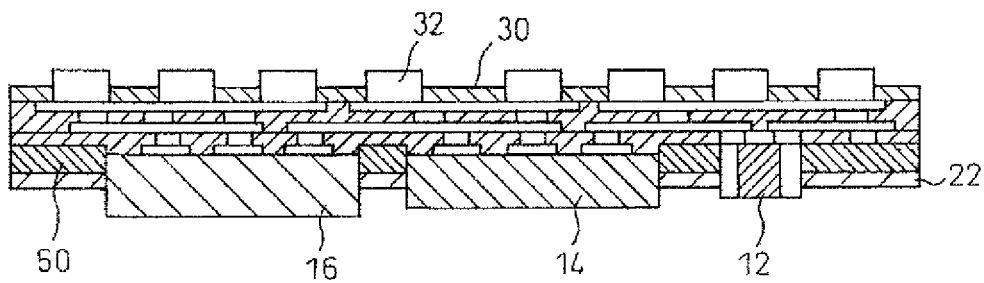
FIG. 8 is a sectional view showing a fine wiring package according to a fourth embodiment of the invention.

In the fourth embodiment shown in FIG. 8, a conductive resin 50 is formed for a reinforcement in place of the conductor layer 44 according to the first embodiment. By the conductive resin 50, a surface of a sealing resin 22 is stabilized so that positions of terminals 12a, 14a and 16a of electronic components 12, 14 and 16 are stabilized and they are flattened. Referring to the conductive resin 50, a part of a wiring layer 28 is also connected to the conductive resin 50 through a via 26 in the same manner as the conductor layer 44 according to the first embodiment. In the fourth embodiment, moreover, an adhesive layer 42 is also peeled together when a second support 40 is peeled, and back faces of the electronic components 12, 14 and 16 are formed to be exposed from the sealing resin 22. In the same manner as in the first embodiment, however, it is also possible to employ a structure in which the second support 40 is peeled from the adhesive layer 42 and the back faces of the electronic components 12, 14 and 16 are covered with the adhesive layer 42.

Figure 9:
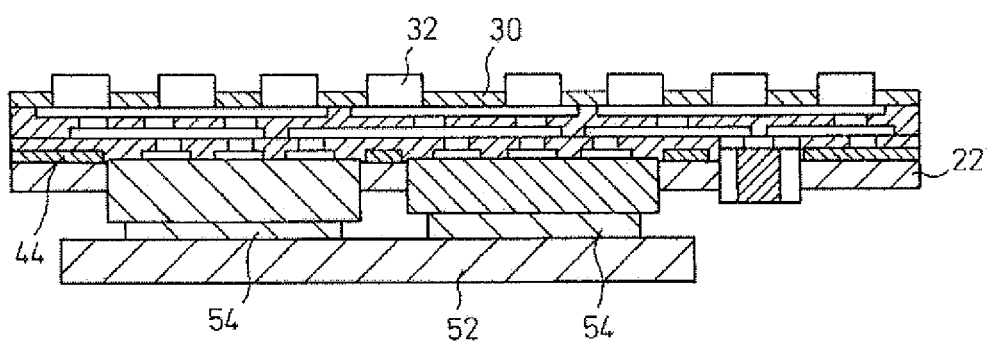
FIG. 9 is a sectional view showing a fine wiring package according to a fifth embodiment of the invention.

In the fifth embodiment shown in FIG. 9, at a corresponding step to FIG. 5A according to the first embodiment, an adhesive layer 42 is also peeled together when a second support 40 is peeled from a package. Consequently, back faces of electronic components 12, 14 and 16 are formed to be exposed from a sealing resin 22. A well-known radiating component 52 such as a heat sink is disposed on the back faces of a part of the electronic components having a heating property, for example, the active elements 14 and 16.

In the case in which the common radiating component 52 to the two active elements 14 and 16 is used as shown in FIG. 9, distances from the radiating component 52 to the back faces of the active elements 14 and 16 are different from each other. In order to control the step, there is used an adhesive 54 which is comparatively thick and has a high thermal conductivity.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

As described above, the fine wiring package and the method of manufacturing the fine wiring package according to the invention can be applied to all semiconductor packages having at least one active element or passive element and can achieve an increase in a fineness of a pitch in an electronic component.

What is claimed is:

1. A fine wiring package comprising: at least one electronic component having a first surface at which a plurality of terminals are formed and a second surface opposite to the first surface; a sealing resin having a first surface co-planar with the first surface of the electronic component or slightly recessed from the first surface of the electronic component toward the second surface of the electronic component, and a second surface opposite to the first surface, the second surface of the sealing resin being recessed from the second surface of the electronic component between the second surface of the electronic component and the first surface of the sealing resin such that the sealing resin covers only a portion of a side surface of the electronic component;

an adhesive layer which covers the second surface of the electronic component and which covers a portion of the side surface of the electronic component and which contacts the second surface of the sealing resin;

a stacked structure which is formed on the first surface of the electronic component and the first surface of the sealing resin and includes an insulating resin layer and a wiring layer to be electrically connected to the terminals of the electronic component; and a reinforcing plate formed on the first surface of the sealing resin, the reinforcing plate contacting the first surface of the sealing resin and being embedded in and covered by the insulating resin layer of the stacked structure; wherein the at least one electronic component comprises a plurality of electronic components, and the reinforcing plate is formed on the first surface of the sealing resin between adjacent electronic components.

2. The fine wiring package according to claim 1, wherein the reinforcing plate includes a conductor layer.

3. The fine wiring package according to claim 1, wherein the reinforcing plate includes a conductive resin layer.

4. The fine wiring package according to claim 1, wherein a part of the wiring layer is connected to the reinforcing plate through a via.

* * * * *